United States Patent
Jung et al.

(10) Patent No.: US 7,252,862 B2
(45) Date of Patent: Aug. 7, 2007

(54) INCREASING ADHESION IN AN IMPRINTING PROCEDURE

(75) Inventors: Gun Young Jung, Mountain View, CA (US); Zhiyong Li, Palo Alto, CA (US); Richard Stanley Williams, Portola Valley, CA (US); Sivapackia Ganapathiappan, Los Altos, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 54 days.

(21) Appl. No.: 10/929,810

(22) Filed: Aug. 30, 2004

(65) Prior Publication Data

US 2006/0046069 A1    Mar. 2, 2006

(51) Int. Cl.
*B05D 3/10* (2006.01)

(52) U.S. Cl. .............. 427/301; 427/302; 428/426; 428/429; 428/448; 428/461; 428/500; 428/522; 428/523

(58) Field of Classification Search ............... None
See application file for complete search history.

(56) References Cited

U.S. PATENT DOCUMENTS

| 6,294,450 | B1 | 9/2001 | Chen et al. | |
| 6,306,495 | B1 * | 10/2001 | Kelber | 428/336 |
| 6,407,443 | B2 | 6/2002 | Chen et al. | |
| 6,432,740 | B1 | 8/2002 | Chen | |
| 6,579,742 | B2 | 6/2003 | Chen | |
| 6,696,220 | B2 | 2/2004 | Bailey et al. | |
| 2003/0082485 | A1 | 5/2003 | Bulthaup et al. | |
| 2003/0113229 | A1 * | 6/2003 | Briones et al. | 422/57 |
| 2003/0138589 | A1 | 7/2003 | Takemori et al. | |

FOREIGN PATENT DOCUMENTS

EP    0598361    5/1994

* cited by examiner

*Primary Examiner*—Marc S. Zimmer

(57) ABSTRACT

A method for increasing adhesion between a substrate and a polymeric imprintable material during an imprinting procedure. The method includes chemically bonding a plurality of molecules to a surface of a substrate to form a self-assembled monolayer thereon. A monomer is copolymerized with the self-assembled monolayer to form a polymeric imprintable material that is chemically bonded to the self-assembled monolayer. Adhesion between the polymeric imprintable material and the substrate is substantially increased by the self-assembled monolayer.

22 Claims, 4 Drawing Sheets

INCREASING ADHESION IN AN IMPRINTING PROCEDURE

BACKGROUND

The present disclosure relates generally to imprinting procedures and more particularly to increasing adhesion between elements used in imprinting procedures.

Nano-imprint lithography was initiated as an alternate process to achieve nanoscale features (about 100 nm or smaller) with high throughput and relatively low cost. During the imprinting process, the nanoscale structures are transferred from a mold to a polymer layer. The mold may be used for the thermal imprint process, as well as for the UV-based imprint process.

In the thermal imprint process, to deform the shape of the polymer, the temperature of the film and mold is generally higher than the glass transition temperature of the polymer, so that the polymer flows more easily to conform to the shape of the mold. Hydrostatic pressure may be used to press the mold into the polymer film, thus forming a replica of the mold in the polymer layer. The press is then cooled below the glass transition temperature to "freeze" the polymer and form a more rigid copy of the features in the mold. The mold is then removed from the substrate.

In the alternate UV imprint process, a UV-curable monomer solution is used instead of a thermoplastic polymer. The monomer layer is formed between the mold and the substrate. When exposed to a UV light, the monomer layer is polymerized to form a film with the desired patterns thereon. The UV-based nanoimprint process may generate patterns at room temperature with low pressure.

A potential problem with these techniques is the possible adhesion of the polymer to the mold. If the polymer sticks to the mold, then the imprinted pattern and/or the mold itself may be damaged when pulling the mold off the substrate. This may damage and/or ruin the imprinted patterns and/or deleteriously affect the mold (which may be very expensive and time-consuming to produce).

To reduce the adhesion of the polymer to the mold, high quality releasing self-assembled monolayers (SAMs) have been attached to the surface of the mold by immersing the mold in a solution of the release agent at a concentration of, for example, $1 \times 10^{-4}$ M. The improved release properties allowed for the enhancement of pattern resolution in the polymer film. "Release property," as referred to herein means how well the mold detaches from the polymer layer after imprinting without the polymer sticking to the mold.

However, where the gap between features on the mold is reduced, the problem regarding adhesion of the polymer to the mold may, in some instances, arise even when a releasing layer is disposed on the mold. In those instances, the polymer may stick to the mold gap and detach from the substrate surface. The substrate surface area may not be large enough to hold the resist because the mold surface area facing the resist may be larger.

Thus, there is a need to provide increased adhesion between the polymer and the substrate so as to substantially avoid the foregoing drawbacks.

SUMMARY

Embodiments of the method increase adhesion between a substrate and a polymeric imprintable material during an imprinting procedure. The method includes chemically bonding a plurality of molecules to a substrate surface to form a self-assembled monolayer thereon. A monomer is copolymerized with the self-assembled monolayer to form the polymeric imprintable material chemically bonded to the self-assembled monolayer. The self-assembled monolayer substantially increases adhesion between the polymeric imprintable material and the substrate.

BRIEF DESCRIPTION OF THE DRAWINGS

Objects, features and advantages of embodiments of the present disclosure will become apparent by reference to the following detailed description and drawings, in which like reference numerals correspond to similar, though not necessarily identical components. For the sake of brevity, reference numerals having a previously described function may not necessarily be described in connection with subsequent drawings in which they appear.

DETAILED DESCRIPTION

Embodiments of the present invention advantageously use a novel concept of providing a self-assembled monolayer (SAM) to substantially improve adhesion during imprinting procedures. It is to be understood that embodiment(s) of the present disclosure may be used for thermal imprint processes, as well as for UV-based imprint processes. In an embodiment, the SAM acts as a linker between a substrate and a polymeric imprintable material (a non-limitative example of which is a resist material) so that the polymeric imprintable material chemically bonds to the substrate. Without being bound to any theory, it is believed that this chemical bond may also aid in the release of the polymeric imprintable material from a mold having features thereon that is used to imprint the polymeric material during, for example, a nano-imprinting procedure.

As used herein, the term "nano-imprint" in connection with a mold refers to molds having features thereon/therein (e.g., protrusions that are adapted to define nanoscale features in a polymer layer, the features being separated by a spacing on the order of between about 30 nanometers (nm) and about 100 nanometers (nm) or smaller). Embodiments of the present disclosure may also advantageously be used in connection with molds having features thereon/therein being separated by a spacing less than 30 nm. Embodiment(s) of the present method may be applied to any processes that may benefit from increased adhesion as disclosed herein for their application.

The nano-imprinting process itself is provided in greater detail in, for example, U.S. Pat. No. 6,294,450, entitled "Nanoscale Patterning for the Formation of Extensive Wires" and issued on Sep. 25, 2001, to Yong Chen et al; U.S. Pat. No. 6,407,443, entitled "Nanoscale Patterning for the Formation of Extensive Wires" and issued on Jun. 18, 2002, to Yong Chen et al; U.S. Pat. No. 6,432,740, entitled "Fabrication of Molecular Electronic Circuit by Imprinting" and issued on Aug. 13, 2002, to Yong Chen; and U.S. Pat. No. 6,579,742, entitled "Fabrication of Molecular Electronic Circuit by Imprinting" and issued on Jun. 17, 2003, to Yong Chen. The contents of the foregoing references are incorporated herein by reference.

Generally, embodiment(s) of the method include forming a polymeric imprintable material such that it is chemically bonded to a self-assembled monolayer that is chemically bonded to a surface of a substrate. These embodiment(s) will be discussed in further detail in reference to the Figures and the Examples.

Figure 1:
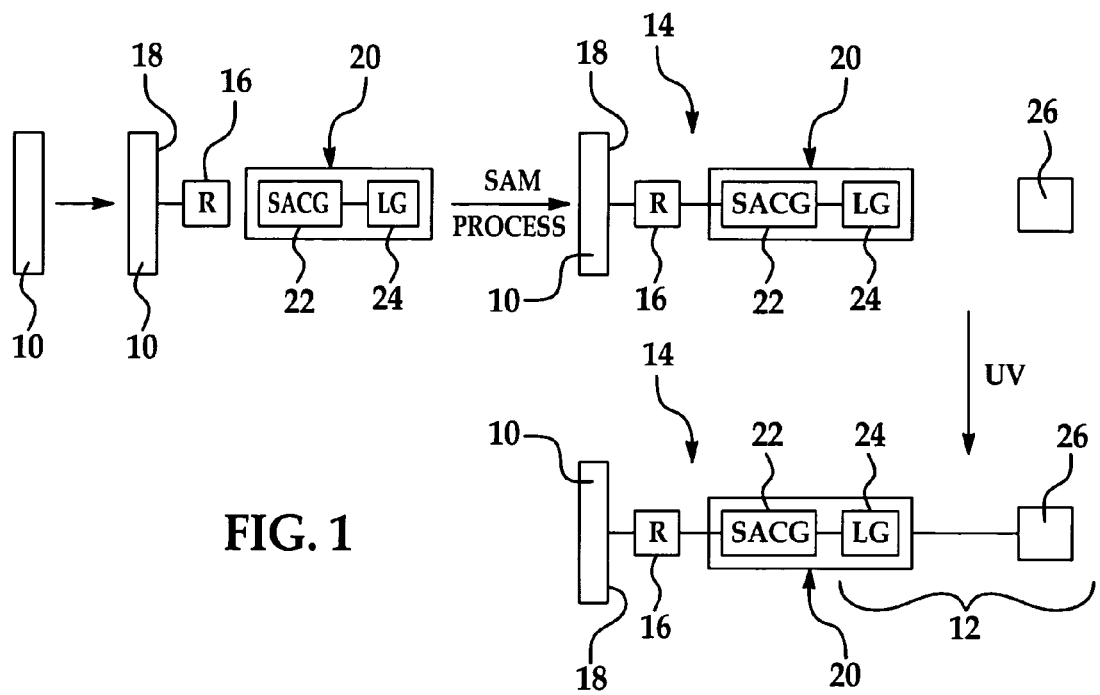
FIG. 1 is a schematic flow diagram depicting an embodiment of a method for increasing adhesion between a substrate and a polymeric imprintable material.

Referring now to FIG. 1, embodiments of a method for substantially increasing adhesion between a substrate 10 and a polymeric imprintable material 12 during an imprinting process generally includes bonding a self-assembled monolayer (SAM) 14 to the substrate 10. It is to be understood that the substrate 10 may be any suitable material. In an embodiment, the substrate 10 is silicon, silicon dioxide, glass, quartz, alumina, germanium, germanium oxide, tin, tin oxide, and mixtures thereof. Further, the substrate 10 may be formed from one or more layers of suitable materials. In a non-limiting example, the substrate 10 is silicon having a layer of silicon dioxide thereon.

The substrate 10 may be treated such that one or more attaching/terminal groups (R) 16 are formed on its surface 18. In an embodiment, the substrate 10 is treated with a piranha solution (e.g., 1 part by volume of 30% $H_2O_2$ to 3 parts by volume of concentrated $H_2SO_4$) to form the attaching group(s) (R) 16. It is to be understood that the attaching group(s) (R) 16 may be any suitable group that is capable of chemically bonding to the molecules 20 that will form the SAM 14. In an embodiment, the attaching groups (R) 16 are hydroxyl groups (—OH), chlorine groups (—Cl), amino groups (—$NH_2$), thiol groups (—SH), acetoxy groups (—OCOR' where R' is an alkyl or a substituted alkyl), and/or mixtures thereof. It is to be understood that the formation of the attaching groups (R) 16 may be accomplished in solution or by a vapor phase treatment.

"Chemically bonding," "chemical bonds," "chemically bonded," and the like as referred to herein may include ionic bonding, covalent bonding, and coordination bonding.

The method further includes chemically bonding a plurality of molecules 20 to the surface 18 of the substrate 10 (for example, via the attaching groups (R) 16) via a SAM process, thus forming the self-assembled monolayer 14. Non-limiting examples of suitable molecule(s) 20 include methacryloxy propyltrichlorosilane, (methacryloyloxypropyl)trimethoxysilane, 3-methacryloxypropylbis(trimethylsiloxy)methylsilane, 3-methacryloxypropyldimethylchlorosilane, 3-methacryloxypropylmethyidichlorosilane, 3-methacryloxypropylmethyldimethoxysilane, 3-acryloxypropylmethyldichlorosilane, acryloxypropylmethyidimethoxysilane, 3-acryloxypropyltrichlorosilane, acryloxypropyltrimethoxysilane, vinyltriacetoxysilane, vinylmethyldiethoxysilane, vinyltrichlorosilane, vinyltrimethoxysilane, vinylmethyidiacetoxysilane, hydroxyethyl methacrylate, hydroxyethyl acrylate, and/or mixtures thereof.

It is to be understood that each molecule 20 has a self-assembling connecting group (SACG) 22 at one end and a linking group (LG) 24 at an opposed end. In an embodiment, the self-assembling connecting group (SACG) 22 is adapted to chemically bond the surface 18 of the substrate 10 (e.g. via the attaching group(s) (R) 16) to the SAM 14. Examples of suitable self-assembling connecting groups (SACG) 22 include, but are not limited to hydroxyl groups, chlorine groups, acetoxy groups, amino groups, thiol groups, and mixtures thereof.

The linking group (LG) 24 of SAM 14 is adapted to copolymerize with a monomer 26 to form the polymeric imprintable material 12. Examples of suitable linking groups (LG) 24 include, but are not limited to acryloxy groups, methacryloxy groups, vinyl groups, and mixtures thereof.

The method further includes copolymerizing the monomer 26 with the linking group (LG) 24 of SAM 14. Any suitable monomer that is capable of copolymerizing with the self-assembled monolayer 14 may be used. In an embodiment, the monomer 26 includes, but is not limited to vinyl monomers, acrylic moieties, styrene moieties, and/or mixtures thereof. Some non-limiting examples of monomer 26 include benzyl methacrylate, styrene, methyl methacrylate, hexyl acrylate, hexyl methacrylate, butyl methacrylate, butyl acrylate, lauryl methacrylate, lauryl acrylate, isodecyl acrylate, isodecyl methacrylate, octadecyl acrylate, octadecyl methacrylate, ethylene glycol dimethacrylate, divinylbenzene, vinylbenzyl chloride, hydroxyethyl methacrylate, hydroxyethyl acrylate, and/or mixtures thereof.

Copolymerization may be initiated by ultraviolet (UV) irradiation and/or thermal treatment. In an embodiment, the ultraviolet light used to copolymerize the monomer 26 with the monolayer 14 may also be the UV light that accomplishes the curing step of a nano-imprinting procedure. It is to be understood that these methods may be performed simultaneously.

As depicted in FIG. 1, the copolymerization of the monomer 26 with the linking group (LG) of SAM 14 forms a polymeric imprintable material 12 chemically bonded to the self-assembled monolayer 14. It is to be understood that the polymeric imprintable material 12 may be a copolymer of any suitable combination of the monomers of linking group (LG) 24 and the monomer 26. In an embodiment, polymeric imprintable material 12 is a negative and/or positive resist polymer. Suitable non-limiting examples of polymeric imprintable material 12 include poly(benzyl methacrylate), poly(styrene), poly(methyl methacrylate), poly(hexyl acrylate), poly(hexyl methacrylate), poly(butyl methacrylate), poly(butyl acrylate), poly(lauryl methacrylate), poly(lauryl acrylate), poly(isodecyl acrylate), poly(isodecyl methacrylate), poly(octadecyl acrylate), poly(octadecyl methacrylate), poly(ethylene glycol dimethacrylate), poly(divinylbenzene), poly(vinylbenzyl chloride), poly(hydroxyethyl methacrylate), poly(hydroxyethyl acrylate), and/or mixtures thereof. In a further embodiment, polymeric imprintable material 12 is poly(benzylmethacrylate). It is to be understood that the polymeric imprintable material 12 is capable of being imprinted with features from, for example, a mold (depicted as 28 in FIGS. 4A and 4B) during an imprinting procedure (e.g. nano-imprinting).

Figure 2:
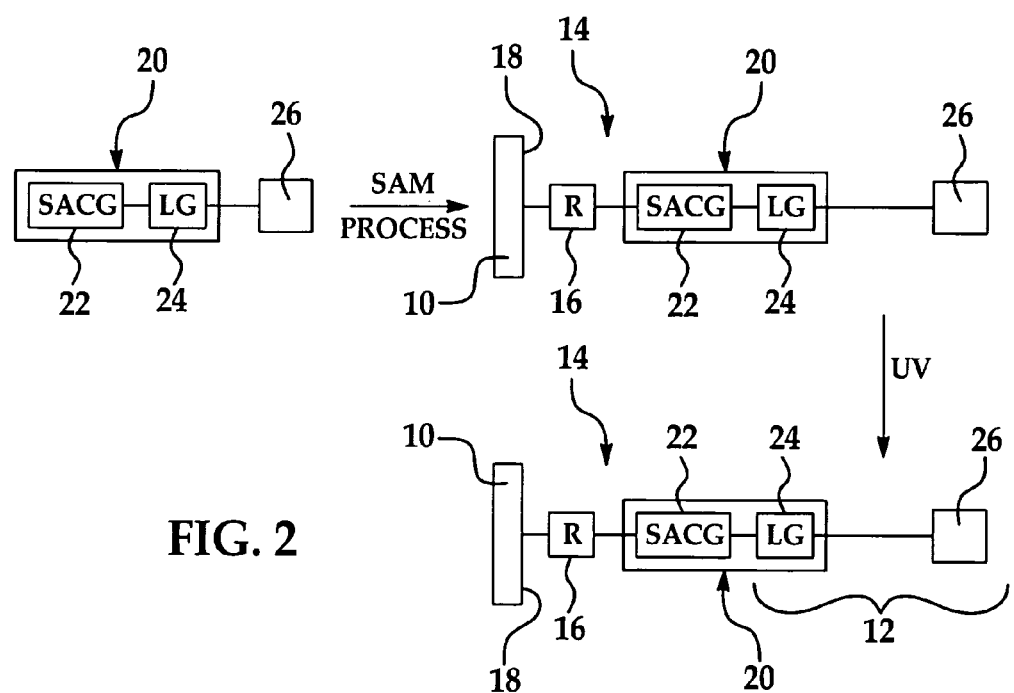
FIG. 2 is a schematic flow diagram depicting an alternate embodiment of the method.

Referring now to FIG. 2, an alternate embodiment of the method is depicted. It is to be understood that the materials described in reference to FIG. 1 may also be used in this embodiment. The method includes first attaching monomers 26 (i.e. a plurality of monomers 26) to the linking groups (LG) 24 of the molecules 20 (i.e. plurality of molecules 20). It is to be understood that attaching the molecules 20 to the monomers 26 may be accomplished by any suitable method that will form a chemical bond between the two.

In this embodiment, the molecules 20 having the monomers 26 attached thereto are chemically bonded via a SAM process to the surface 18 of substrate 10 to form a SAM 14 having the monomers 26 attached thereto. As previously described, the substrate 10 may have attaching groups (R) 16 that are capable of chemically bonding to the molecule(s) 20 to form the SAM 14.

The plurality of monomers 26 may then be copolymerized with linking groups (LG) 24 of the SAM 14 to form the polymeric imprintable material 12 chemically bonded to the SAM 14. The copolymerization may be initiated via UV light and/or thermal treatment.

Without being bound to any theory, it is believed that the incorporation of the SAM 14 between the substrate 10 and the polymeric imprintable material 12 via embodiments of the method disclosed herein advantageously substantially increases the adhesion between the substrate 10 and the polymeric imprintable material 12. It is believed that the self-assembled monolayer 14 acts as a linker between the substrate 10 and the polymeric imprintable material 12 so that the polymeric imprintable material 12 chemically bonds to the substrate 10. The chemical bond and increase in adhesion may advantageously decrease the undesirable detachment of the polymeric imprintable material 12 from the substrate 10 during an imprinting process. Further, in embodiments of the method in which a mold is used to imprint the material, the polymeric imprintable material 12 is adapted to contact the mold. It is believed that the increased adhesion between the polymeric imprintable material 12 and the substrate 10 aids in releasing the polymeric imprintable material 12 from the mold.

Figures 3, 5:
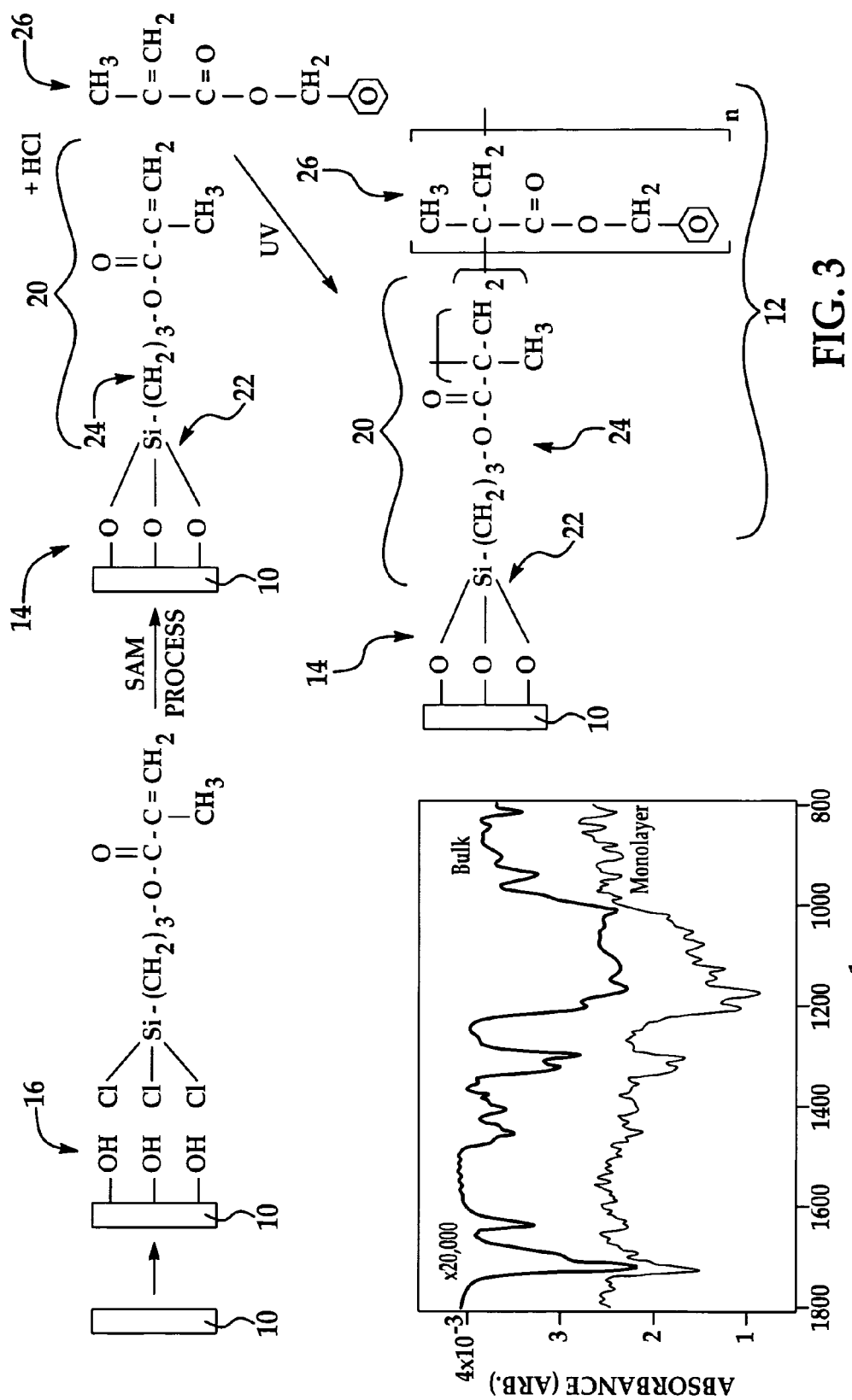
FIG. 3 is similar to FIG. 1, but depicts an alternate embodiment of a method.
FIG. 5 is a graph comparing the RAIR spectra of the monolayer on a silicon substrate to the bulk spectra of the molecules.

Non-limitative embodiments of the method and the substrate 10 are shown in FIG. 3. In this embodiment, the surface 18 of the substrate 10 is treated with the piranha solution described above to form —OH attaching groups (R) 16 thereon. The molecules 20 that are adapted to form the SAM 14 are methacryloxy propyltrichlorosilane molecules where the trichlorosilane end is the self-assembling connecting group (SACG) 22 and the methacryloxy end is the linking group (LG) 24. The molecules 20 are covalently bonded via the connecting group(s) (SACG) 22 to the —OH groups on the substrate 10. It is to be understood that once the SAM 14 is formed, the substrate 10 may be cleaned and dried prior to copolymerization.

The SAM 14 is then copolymerized in ultraviolet irradiation with a solution of benzyl methacrylate. The methacrylate chemically bonds to the methacryloxy end of the molecule 20.

Figure 4A:
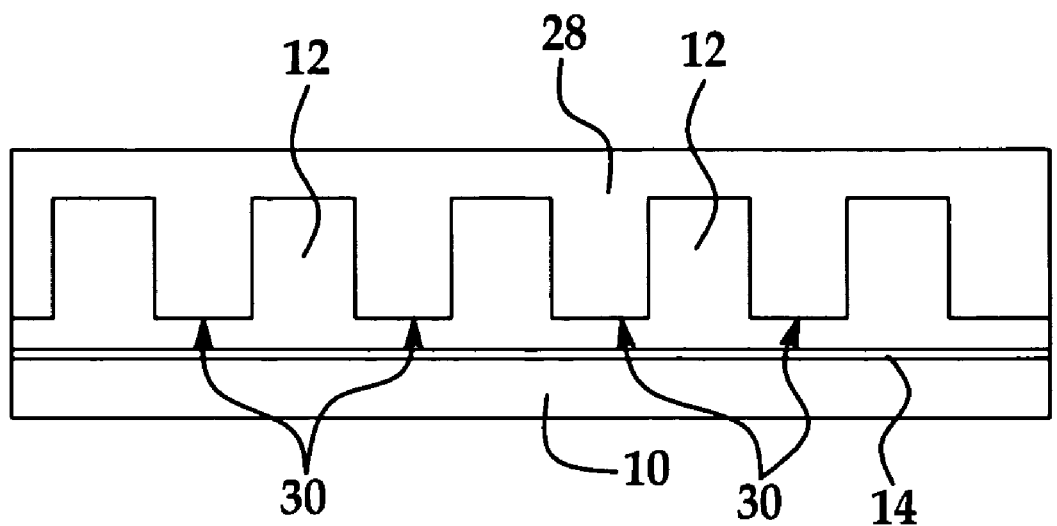
FIG. 4A is a schematic view of a mold in contact with an embodiment of the polymeric imprintable material chemically bonded to a substrate via a self-assembled monolayer.

FIG. 4A depicts a non-limitative embodiment wherein a mold 28 is in contact with the polymeric imprintable material 12. The polymeric imprintable material 12 is attached to a substrate 10 via a self-assembled monolayer 14 formed by an embodiment of the method disclosed herein. As shown in FIG. 4A, the mold 28 has features 30 defined therein to which the polymeric imprintable material 12 may conform during an imprinting process. One challenge that may arise during imprinting is that the polymeric imprintable material 12 may, in some instances, adhere to the mold 28 rather than to the substrate 10 when the substrate 10 is separated from the mold 28. Without being bound to any theory, it is believed that this may be due, at least in part, to surface and interfacial energies. The total free energies of the surfaces and interfaces of the initial system before mold 28-substrate 10 separation may be expressed by the following equation:

$$G_i = A_{r-s}\gamma_{r-s} + A_{r-m}\gamma_{r-m}. \quad (1)$$

After separation, there are two possible outcomes—the polymeric imprintable material 12 may adhere to the mold 28 or to the substrate 10. If the polymeric imprintable material 12 detaches from the mold 28, the total free energy of the final system is:

$$G_f = A_{r-s}\gamma_{r-s} + A_{r-m}(\gamma_r + \gamma_m). \quad (2)$$

However, if the polymeric imprintable material 12 detaches from the substrate 10, the total free energy of the final system is:

$$G_f = A_{r-m}\gamma_{r-m} + A_{r-s}(\gamma_r + \gamma_s). \quad (3)$$

In the above equations, $\gamma_r$, $\gamma_s$, and $\gamma_m$ are the surface free energies per area of the polymeric imprintable material 12, of the substrate 10, and of the mold 28, respectively; $\gamma_{r-m}$ and $\gamma_{r-s}$ are interface free energies per area of the polymeric imprintable material 12—mold 28 interface and of the polymeric imprintable material 12—substrate 10 interface, respectively; $A_{r-s}$ and $A_{r-m}$ are the interface areas between the polymeric imprintable material 12 and the substrate 10 and between the polymeric imprintable material 12 and the mold 28, respectively. For the polymeric imprintable material 12 to detach from the mold 28 and to adhere to the substrate 10, the following applies:

$$\Delta G_{Detachment\ from\ mold} < \Delta G_{Detachment\ from\ substrate} \quad (4)$$

$$\Leftrightarrow A_{r-m}(\gamma_r + \gamma_m - \gamma_{r-m}) < A_{r-s}(\gamma_r + \gamma_s - \gamma_{r-s}) \quad (5)$$

Without subscribing to any particular theory, it is believed that in single layer processing, the height of the polymeric imprintable material 12 may remain consistent in order to preserve process latitude in subsequent steps even though the lateral feature 30 size of the mold 28 may be shrinking as the pitch sizes decrease. This may cause the contact area between the mold 28 and the polymeric imprintable material 12, $A_{r-m}$, to increase. At certain pitch sizes, the left hand term in equation (5) will become larger than the right hand term, and the polymeric imprintable material 12 may adhere to the mold 28 and detach from the substrate 10.

Figure 4B:
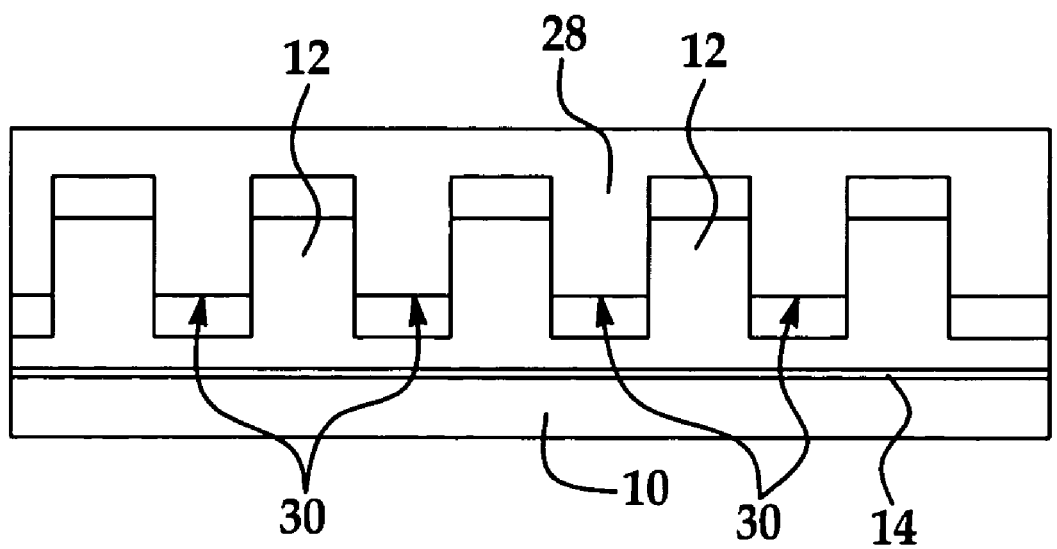
FIG. 4B is a schematic view of the mold detached from an embodiment of the polymeric imprintable material chemically bonded to the substrate via the self-assembled monolayer.

Referring now to FIG. 4B, the presence of the SAM 14 assists in increasing the adhesion between the substrate 10 and the polymeric imprintable material 12. As depicted, upon releasing the mold 28 from the substrate 10, the polymeric imprintable material 12 remains adhered to the substrate 10. Without subscribing to any particular theory, it is believed that the SAM 14 assists in decreasing the free energy of the polymeric imprintable material 12—substrate 10 interface $\gamma_{r-s}$, thus increasing adhesion between the polymeric imprintable material 12 and the substrate 10.

To further illustrate embodiment(s) as disclosed herein, reference is made to the following examples. The following examples are for illustrative purposes and are not intended to limit the scope of the present disclosure.

EXAMPLES

Doped silicon substrates (As>$10^{20}$ cm$^{-3}$) and BOROFLOAT® brand (commercially available from SCHOTT North America, Inc. in Elmsford, N.Y.) borosilicate float glass substrates were used. The borosilicate float glass substrates had a thickness of about 0.7 mm and were polished to a low surface roughness of about 0.4 nm rms in 1 µm$^2$ Hydroxyl terminations on the silicon substrate surface and the glass substrate surface were generated by dipping the substrates in the piranha solution for about 15 minutes and then subjecting the substrates to a water vapor plasma treatment for about 10 minutes at a power of about 10 W and a pressure of about 0.7 torr.

The silicon and glass substrates with hydroxyl groups attached thereon were dipped into a toluene solution containing about 0.2 wt % of methacryloxy propyltrichlorosilane molecules for about 1 hour to form the self-assembled monolayer (SAM). The substrates were cleaned with a toluene solvent in an ultrasonic bath and dried by a nitrogen blow.

The monolayer formed on the silicon substrate was investigated by ellipsometry thickness measurements and Reflection Absorption Infrared Spectroscopy (RAIRS). The ellipsometry measurements taken included both the thicknesses of the surface layer for a bare silicon substrate having a native oxide layer thereon (0.91±0.15 nm), and of the silicon substrate with the monolayer (2.13±0.19 nm). The difference between the two measurements is about 1.2 nm, which is consistent with the length of the molecules used to form the monolayer.

The RAIR spectra of the monolayer on the silicon substrate is compared to the bulk spectra of the surface promoter (e.g. the methacryloxy propyl-trichlorosilane molecules) as shown in FIG. 5. As depicted, the majority of the peaks from the bulk sample spectra are also present in the monolayer spectra. In particular, the peak located at 1726 cm$^{-1}$, which is a characteristic vibration mode of carbonyl groups in the methacryloxy molecules, is observed with strong intensity in the monolayer. Further, peaks at 1635 cm$^{-1}$ (C=C stretch), 1300 cm$^{-1}$ (C—O—C stretch) and 1173 cm$^{-1}$ (C—O stretch) were found in the monolayer. These peaks indicate the formation of a methacryloxy propyltrichlorosilane monolayer on the silicon substrate surface.

The formulation of the UV-curable monomer solution was composed of three ingredients. IRGACURE 184 (absorption peak: 280 nm and 320 nm, available commercially from Ciba located in Basel, Switzerland) was used as the UV-sensitive free radical generator and was dissolved into a benzyl methacrylate monomer solution (commercially available from Aldrich located in St. Louis, Mo.). In addition, 2-hydroxyethyl methacrylate (commercially available from Aldrich) was added to lower the surface energy for easy mold release from the resist (i.e. the polymeric imprintable material 12). The composition of the solution was 77 wt. % of monomer, 20 wt. % of releasing promoter, and 3 wt. % of free radical generator. The solution was filtrated through syringe filters with a 0.2 μm pore size to remove residual particles.

The SAM layer on both the silicon substrates and the glass substrates was copolymerized with the UV-curable monomer solution. Copolymerization was initiated with ultraviolet irradiation. A mercury lamp (280 nm~320 nm) was used as the UV light source with an intensity of about 7 W/cm$^2$. Molds having a releasing agent of organosilane were used to nano-imprint the resists under the UV light.

Figure 6:
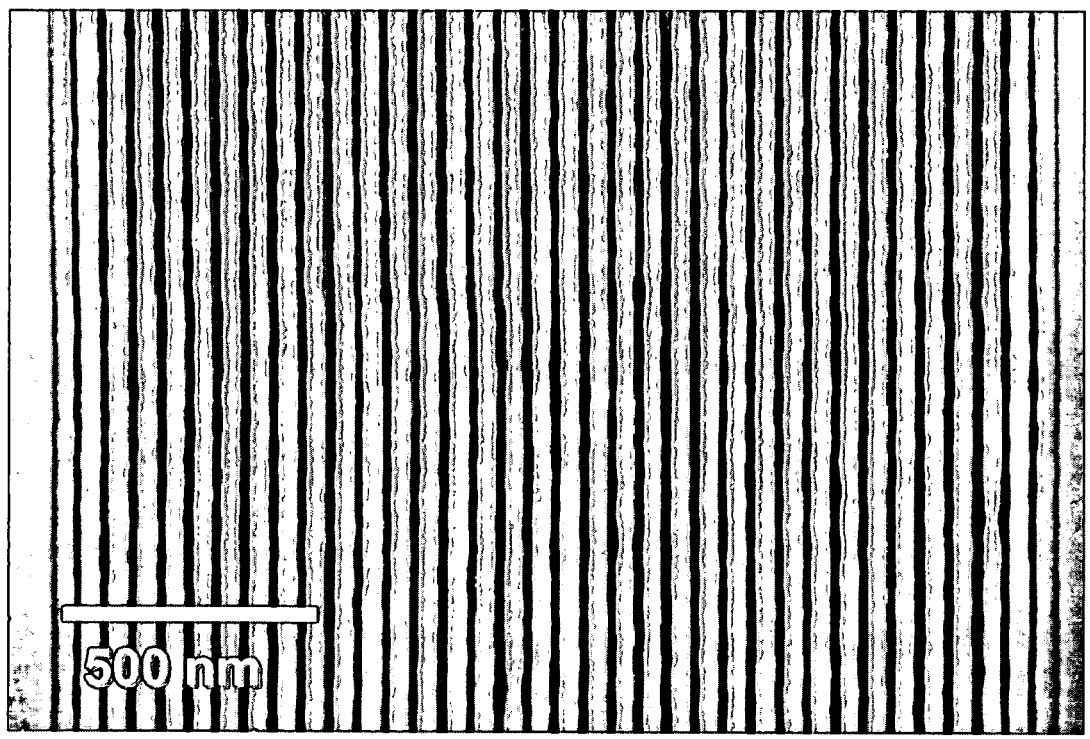
FIG. 6 is a SEM image of an embodiment of the polymeric imprintable material imprinted with a pattern of 37 nanowires.

FIG. 6 depicts a SEM image of a pattern of 37 nanowires imprinted in the polymer resist attached to the glass substrate. The molecules that formed the monolayer substantially improved the resist adhesion to the glass substrate surface through the chemical bond, resulting in the 37 isolated nanowire patterns. It is believed that the bond substantially advantageously prevented the resist from peeling off of the glass substrate while the mold was detached from the resist by hand.

Embodiment(s) of the method disclosed herein offer many advantages, non-limitative embodiments of which include the following. In an embodiment, the formation of a monolayer on a substrate surface substantially increases the adhesion between the substrate and the formed polymeric imprintable material in an imprinting process. This may advantageously allow the polymeric imprintable material to adhere to the substrate rather than to a mold upon releasing the material from the mold.

While several embodiments have been described in detail, it will be apparent to those skilled in the art that the disclosed embodiments may be modified. Therefore, the foregoing description is to be considered exemplary rather than limiting.

What is claimed is:

1. A method for increasing adhesion between a substrate and a polymeric imprintable material during an imprinting procedure, the method comprising:
   chemically bonding a plurality of molecules to a surface of the substrate to form a self-assembled monolayer thereon;
   copolymerizing a monomer with the self-assembled monolayer to form the polymeric imprintable material chemically bonded to the self-assembled monolayer; and
   forming at least one of hydroxyl groups, chlorine groups, amino groups, thiol groups, or acetoxy groups on the surface of the substrate prior to chemically bonding the plurality of molecules;
   wherein the at least one of the hydroxyl groups, chlorine groups, amino groups, thiol groups, or acetoxy groups is adapted to chemically bond to at least one of the plurality of molecules, and wherein adhesion between the polymeric imprintable material and the substrate is substantially increased by the self-assembled monolayer, and wherein the substrate is selected from silicon, silicon dioxide, glass, quartz, alumina, germanium, germanium oxide, tin, tin oxide, layers thereof, and combinations thereof.

2. The method as defined in claim 1 wherein each of the plurality of molecules comprises a self-assembling connecting group at one end and a linking group at an opposed end.

3. The method as defined in claim 2 wherein the self-assembled monolayer is chemically bonded to the polymeric imprintable material via the linking group.

4. The method as defined in claim 2 wherein the self-assembled monolayer is chemically bonded to the surface of the substrate via the self-assembling connecting group.

5. The method as defined in claim 2 wherein the self-assembling connecting group comprises at least one of hydroxyl groups, chlorine groups, acetoxy groups, amino groups, thiol groups, or mixtures thereof, and wherein the linking group comprises at least one of acryloxy groups, methacryloxy groups, vinyl groups, or mixtures thereof.

6. A method for increasing adhesion between a substrate and a polymeric imprintable material during an imprinting procedure, the method comprising:
   chemically bonding a plurality of molecules to a surface of the substrate to form a self-assembled monolayer thereon, wherein each of the plurality of molecules includes a self-assembling connecting group at one end and a linking group at an opposed end;
   copolymerizing a monomer with the self-assembled monolayer to form the polymeric imprintable material chemically bonded to the self-assembled monolayer; and
   forming at least one of hydroxyl groups, chlorine groups, amino groups, thiol groups, or acetoxy groups on the surface of the substrate prior to chemically bonding the plurality or molecules;

wherein the at least one of the hydroxyl groups, chlorine groups, amino groups, thiol groups, or acetoxy groups is adapted to chemically bond to at least one of the self-assembling connecting groups, and wherein adhesion between the polymeric imprintable material and the substrate Is substantially increased by the self-assembled monolayer.

7. A method for increasing adhesion between a substrate and a polymeric imprintable material during an imprinting procedure, the method comprising:
chemically bonding a plurality of molecules to a surface of the substrate to form a self-assembled monolayer thereon;
copolymerizing a monomer with the self-assembled monolayer to form the polymeric imprintable material chemically bonded to the self-assembled monolayer; and
forming at least one of hydroxyl groups, chlorine groups, amino groups, thiol groups, or acetoxy groups on the surface of the substrate prior to chemically bonding the plurality of molecules;
wherein the at least one of the hydroxyl groups, chlorine groups, amino groups, thiol groups, or acetoxy groups is adapted to chemically bond to the plurality of molecules, and wherein adhesion between the polymeric imprintable material and the substrate is substantially increased by the self-assembled monolayer.

8. The method as defined in claim 1 wherein chemically bonding is accomplished via ionic bonding, covalent bonding, and coordination bonding.

9. The method as defined in claim 1 wherein copolymerization is initiated by at least one of ultraviolet Irradiation or thermal treatment.

10. The method as defined in claim 1 wherein the monomer comprises at least one of benzyl methacrylate, styrene, methyl methacrylate, hexyl acrylate, hexyl methacrylate, butyl methacrylate, butyl acrylate, lauryl methacrylate, lauryl acrylate, isodecyl acrylate, isodecyl methacrylate, octadecyl acrylate, octadecyl methacrylate, ethylene glycol dimethacrylate, divinylbenzene, vinylbenzyl chloride, hydroxyethyl methacrylate, hydroxyethyl acrylate, or mixtures thereof.

11. A method for increasing adhesion between a substrate and a polymeric imprintable material during an imprinting procedure, the method comprising:
chemically bonding a plurality of molecules to a surface of the substrate to form a self-assembled monolayer thereon;
copolymerizing a monomer with the self-assembled monolayer to form the polymeric imprintable material chemically bonded to the self-assembled monolayer; and
forming at least one of hydroxyl groups, chlorine groups, amino groups, thiol groups, or acetoxy groups on the surface of the substrate prior to chemically bonding the plurality of molecules;
wherein the at least one of the hydroxyl groups, chlorine groups, amino groups, thiol groups, or acetoxy groups is adapted to chemically bond to at least one of the plurality of molecules, and wherein adhesion between the polymeric imprintable material and the substrate is substantially increased by the self-assembled monolayer, and wherein the plurality of molecules comprises at least one molecular species selected from methacryloxy propyltrichlorosilane, (methacryloyloxypropyl)trimethoxysilane, 3-methacryloxypropylbis(trimethylsiloxy)methoxysilane 3-methacryloxypropyldimethylchlorosilane 3-methacryloxypropylmethyldichlorosilane 3-methacryloxypropylmethyldimethoxysilane, 3-acryloxypropylmethyldichlorosilane,
acryloxypropylmethyldimethoxysilane 3-acryloxypropyltrichlorosilane, acryloxypropyltrimethoxysilane, vinyltriacetoxysilane, vinylmethyldiethoxysilane, vinyltrichlorosilane, vinyltrimethoxysilane, vinylmethyldiacetoxysilane, hydroxyethyl methacrylate, hydroxyethyl acrylate, and mixtures thereof.

12. The method as defined in claim 11 wherein the substrate comprises silicon, silicon dioxide, glass, quartz, alumina, germanium, germanium oxide, tin, tin oxide, or mixtures thereof.

13. A method for increasing adhesion between a substrate and a polymeric imprintable material during an imprinting procedure, the method comprising:
chemically bonding a plurality of molecules to a surface of the substrate to form a self-assembled monolayer thereon; and
copolymerizing a monomer with the self-assembled monolayer to form the polymeric imprintable material comprising a resist polymer chemically bonded to the self-assembled monolayer;
wherein adhesion between the polymeric imprintable material and the substrate is substantially increased by the self-assembled monolayer, and wherein the substrate is selected from silicon, silicon dioxide, glass, quartz, alumina, germanium, germanium oxide, tin, tin oxide, layers thereof, and combinations thereof.

14. A method for coating a substrate with a self-assembled monolayer for increasing adhesion between the substrate and a polymeric Imprintable material during an imprinting procedure, the method comprising:
forming at least one hydroxyl group on a surface of the substrate;
chemically bonding a plurality of molecules to a surface of the substrate to form a self-assembled monolayer thereon, each of the plurality of molecules having a self-assembling connecting group at one end and a linking group at an opposed end, wherein at least one self-assembling connecting group bonds with the at least one hydroxyl group; and
copolymerizing a plurality of monomers with the linking groups to form the polymeric imprintable material chemically bonded to the self-assembled monolayer;
wherein adhesion between the polymeric imprintable material and the substrate is substantially increased by the self-assembled monolayer.

15. The method as defined in claim 14 wherein the linking group comprises at least one of acryloxy groups, methacryloxy groups, vinyl groups, or mixtures thereof.

16. The method as defined in claim 14 wherein the self-assembling connecting group comprises at least one of hydroxyl groups, chlorine groups, acetoxy groups, amino groups, thiol groups, or mixtures thereof.

17. The method as defined in claim 14 wherein chemically bonding is accomplished via ionic bonding, covalent bonding, and coordination bonding.

18. The method as defined in claim 14 wherein copolymerization is initiated by at least one of ultraviolet Irradiation or thermal treatment.

19. The method as defined in claim 14 wherein the monomer comprises at least one of benzyl methacrylate, styrene, methyl methacrylate, hexyl acrylate, hexyl methacrylate, butyl methacrylate, butyl acrylate, lauryl methacrylate, lauryl acrylate, isodecyl acrylate, isodecyl methacrylate, octadecyl acrylate, octadecyl methacrylate, ethylene glycol dimethacrylate, divinylbenzene, vinylbenzyl chloride, hydroxyethyl methacrylate, hydroxyethyl acrylate, or mixtures thereof.

20. The method as defined in claim 14 wherein the plurality of molecules comprises at least one molecular species selected from methacryloxy propyltrichlorosilane, (methacryloyloxypropyl)trimethorysilane 3-methacryloxypropylbis(trimethylsiloxy)methylsilane, 3-methacryloxypropyldimethylchlorosilane, 3-methacryloxypropylmethyldichlorosilane, 3-methacryloxypropymethyldimethoxysilane, 3-acryloxypropylmethyldichlorosilane, acryloxypropylmethyldimethoxysilane, 3-acryloxypropyltrichlorosilane, acryloxypropyltrimethoxysilane, vinyltriacetoxysilane, vinylmethyldiethoxysilane, vinyltrichlorosilane, vinyltrimethoxysilane, vinytmethyldiacetoxysilane, hydroxyethyl methacrylate, hydroxyethyl acrylate, and mixtures thereof.

21. The method as defined in claim 14 wherein the substrate comprises silicon, silicon dioxide, glass, quartz, alumina, germanium germanium oxide, tin, tin oxide, or mixtures thereof.

22. The method as defined in claim 14 wherein the polymeric imprintable material is a resist polymer.

* * * * *

UNITED STATES PATENT AND TRADEMARK OFFICE
CERTIFICATE OF CORRECTION

PATENT NO.         : 7,252,862 B2
APPLICATION NO. : 10/929810
DATED                  : August 7, 2007
INVENTOR(S)        : Gun Young Jung et al.

It is certified that error appears in the above-identified patent and that said Letters Patent is hereby corrected as shown below:

In column 3, line 59, delete "3-methacryloxypropylmethyidichlorosilane," and insert -- 3-methacryloxypropylmethyldichlorosilane, --, therefor.

In column 3, lines 61-62, delete "acryloxypropylmethyidimethoxysilane," and insert -- acryloxypropylmethyldimethoxysilane, --, therefor.

In column 3, line 65 delete "vinylmethyidiacetoxysilane," and insert -- vinylmethyldiacetoxysilane, --, therefor.

In column 6, line 9, delete "$(\gamma_r+\gamma_m.$" and insert -- $(\gamma_r+\gamma_m)$. --, therefor.

In column 8, line 67, in Claim 6, delete "or" and insert -- of --, therefor.

In column 9, line 6, in Claim 6, delete "Is" and insert -- is --, therefor.

In column 9, line 32, in Claim 9, delete "Irradiation" and insert -- irradiation --, therefor.

In column 9, line 67, in Claim 11, delete "methoxysilane" and insert -- methylsilane, --, therefor.

In column 10, line 1, in Claim 11, after "3-methacryloxypropyldimethylchlorosilane" insert -- , --.

In column 10, line 2, in Claim 11, insert -- , -- before "3-methacrylox".

In column 10, line 5, in Claim 11, insert -- , -- before "3-acryloxypro".

In column 10, line 33, in Claim 14, delete "Imprintable" and insert -- imprintable --, therefor.

In column 10, lines 61-62, in Claim 18, delete "Irradiation" and insert -- irradiation --, therefor.

UNITED STATES PATENT AND TRADEMARK OFFICE
CERTIFICATE OF CORRECTION

PATENT NO. : 7,252,862 B2
APPLICATION NO. : 10/929810
DATED : August 7, 2007
INVENTOR(S) : Gun Young Jung et al.

It is certified that error appears in the above-identified patent and that said Letters Patent is hereby corrected as shown below:

In column 11, line 8, in Claim 20, delete "trimethorysilane" and insert -- trimethoxysilane, --, therefor.

In column 11, line 12, in Claim 20, delete "3-methacryloxypropymethyldimethoxysilane," and insert -- 3-methacryloxypropylmethyldimethoxysilane, --, therefor.

In column 12, line 4, in Claim 20, delete "vinytmethyldiacetoxysilane," and insert -- vinylmethyldiacetoxysilane, --, therefor.

In column 12, line 8, in Claim 21, insert -- , -- before "germanium oxide".

Signed and Sealed this

Twenty-first Day of July, 2009

JOHN DOLL
*Acting Director of the United States Patent and Trademark Office*